United States Patent [19]

Sheppard

[11] Patent Number: 4,495,602
[45] Date of Patent: Jan. 22, 1985

[54] MULTI-BIT READ ONLY MEMORY CIRCUIT

[75] Inventor: Douglas P. Sheppard, Grapevine, Tex.

[73] Assignee: Mostek Corporation, Carrollton, Tex.

[21] Appl. No.: 335,164

[22] Filed: Dec. 28, 1981

[51] Int. Cl.³ .............................................. G11C 7/00
[52] U.S. Cl. ...................................... 365/104; 365/203
[58] Field of Search ................... 365/94, 104, 45, 168, 365/178, 184, 194, 207, 203

[56] References Cited

U.S. PATENT DOCUMENTS

| | | | |
|---|---|---|---|
| 4,090,257 | 5/1978 | Williams | 365/184 |
| 4,179,626 | 12/1979 | Oehler | 365/184 X |
| 4,192,014 | 3/1980 | Craycraft | 365/104 |
| 4,342,102 | 7/1982 | Puar | 365/104 X |

Primary Examiner—Joseph A. Popek

[57] ABSTRACT

A read only memory circuit (10) includes an array of memory transistors including a row of such transistors (12-28) connected to a common word line (30). For each column of memory transistors there is provided a set of reference transistors which receive a word line signal which is concurrent with any word line signal provided to any word line in the memory array. Column decode signals (CD1-CD4) are provided to select a memory transistor on an activated word line and to select corresponding reference transistors. The memory transistor is fabricated to have one of a plurality of threshold voltages. The reference transistors are fabricated to have different predetermined threshold voltages. The drive signals are applied through the word lines concurrently to the selected memory transistor and corresponding reference transistors to cause the transistors to transition from a first state to a second state. Decoding circuitry is provided to determine the time sequence of transition of the memory transistor relative to the reference transistors. This decoding produces an output signal which corresponds to the threshold voltage and therefore the data state for the selected memory transistor.

5 Claims, 6 Drawing Figures

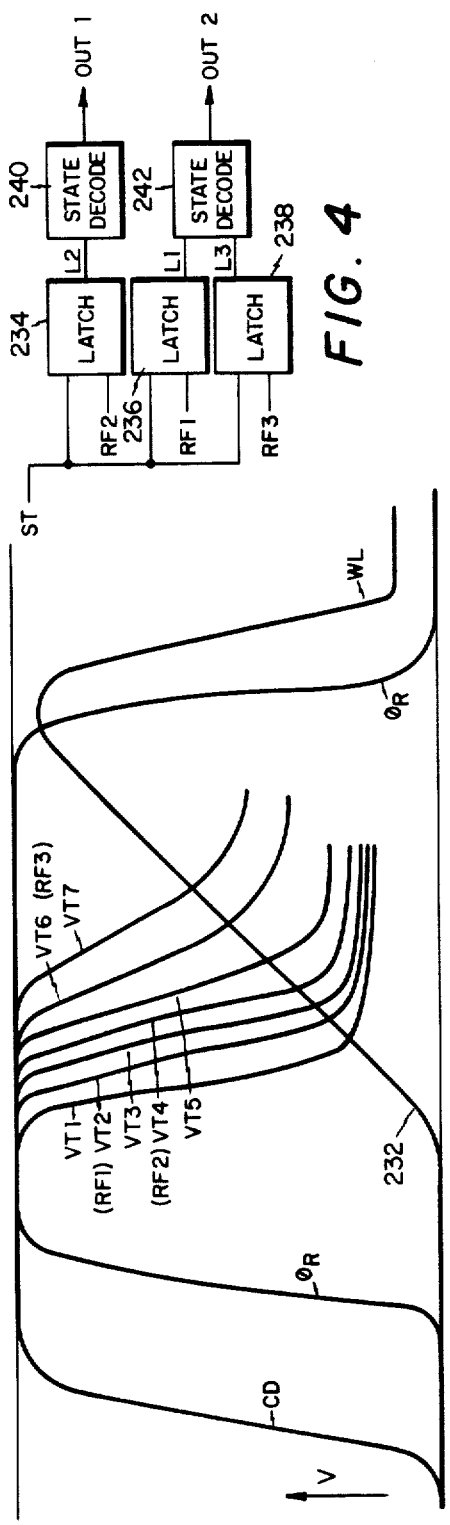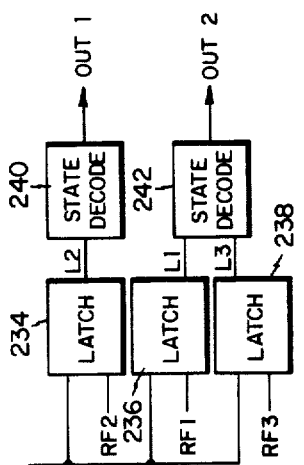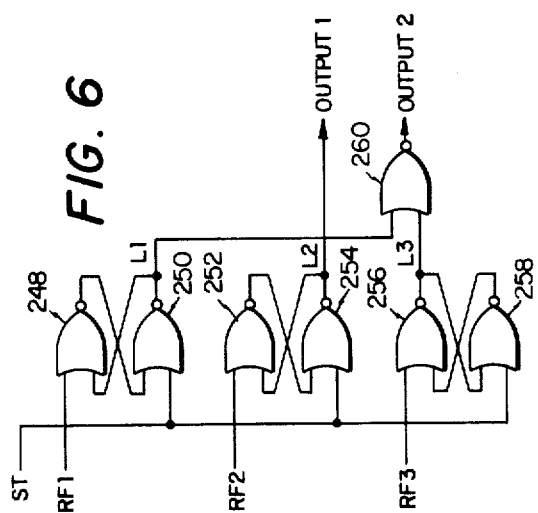

MULTI-BIT READ ONLY MEMORY CIRCUIT

BACKGROUND OF THE INVENTION

The introduction of large scale integration techniques has brought about the construction of large memory arrays on a single silicon chip. These memory arrays are made up of a large number of storage cells fabricated with a high packing density with the lowest possible power consumption.

There is a continuing demand to increase the storage cell density for semiconductor memory chips. The greater density reduces the manufacturing cost per unit of memory storage. However, the limits of fabrication density are rapidly being reached for existing manufacturing equipment.

With the advance of semiconductor technology the technique of ion implantation has become well developed. This technique permits an accurate fabrication of the threshold voltage for a transistor such that the transistor can be caused to switch at an accurately determined amplitude of drive signal. This technique of ion implantation has been implemented for a multi-bit read only memory circuit which is described in U.S. Pat. No. 4,202,044 issued to Beilstein, Jr., et al., on May 6, 1980 and entitled, "Quanternary FET Read Only Memory."

In view of the demand for greater storage density in semiconductor memories and the ability to precisely fabricate threashold voltages in field effect transistors, there exists a need for a read only memory circuit which can utilize multi-level ion implementation to provide a plurality of bits of storage in each memory storage transistor. Such a read only memory circuit further requires a fast and accurate sensing circuit for reading the multi-bit data stored in the multi-bit memory cells.

SUMMARY OF THE INVENTION

A selected embodiment of the present invention comprises a read only memory circuit which includes a memory transistor that is fabricated to have one of a plurality of threshold voltages with each threshold voltage corresponding to a data state. The memory circuit further includes a plurality of reference transistors with each reference transistor having a separate threshold voltage. Circuitry is provided for driving the memory transistor and the reference transistors from a first state to a second state. Further circuitry is provided for comparing the time sequence of transition from the first state to the second state for the memory transistor relative to the reference transistors to generate an output signal representing the data state for the memory transistor.

BRIEF DESCRIPTION OF THE DRAWINGS

For a more complete understanding of the present invention and the advantages thereof, reference is now made to the following description, taken in conjunction with the accompanying drawings in which:

FIG. 2 is a chart illustrating the production of a plurality of implant thresholds using a lesser number of implant operations, FIG. 3 is a waveform diagram illustrating the state transistors for the memory and reference transistors as a function of the word line drive voltage, FIG. 4 is a logic diagram for the state decoding circuitry for use with the present invention, FIG. 5 is a chart illustrating the logical relationship of the state signal, reference signals and output data signals for the circuits illustrated in FIGS. 1 and 3, and FIG. 6 is a schematic logic diagram of a decoding circuit for use with the memory and reference transistor circuit shown in FIG. 1.

DETAILED DESCRIPTION OF THE INVENTION

Figure 1:
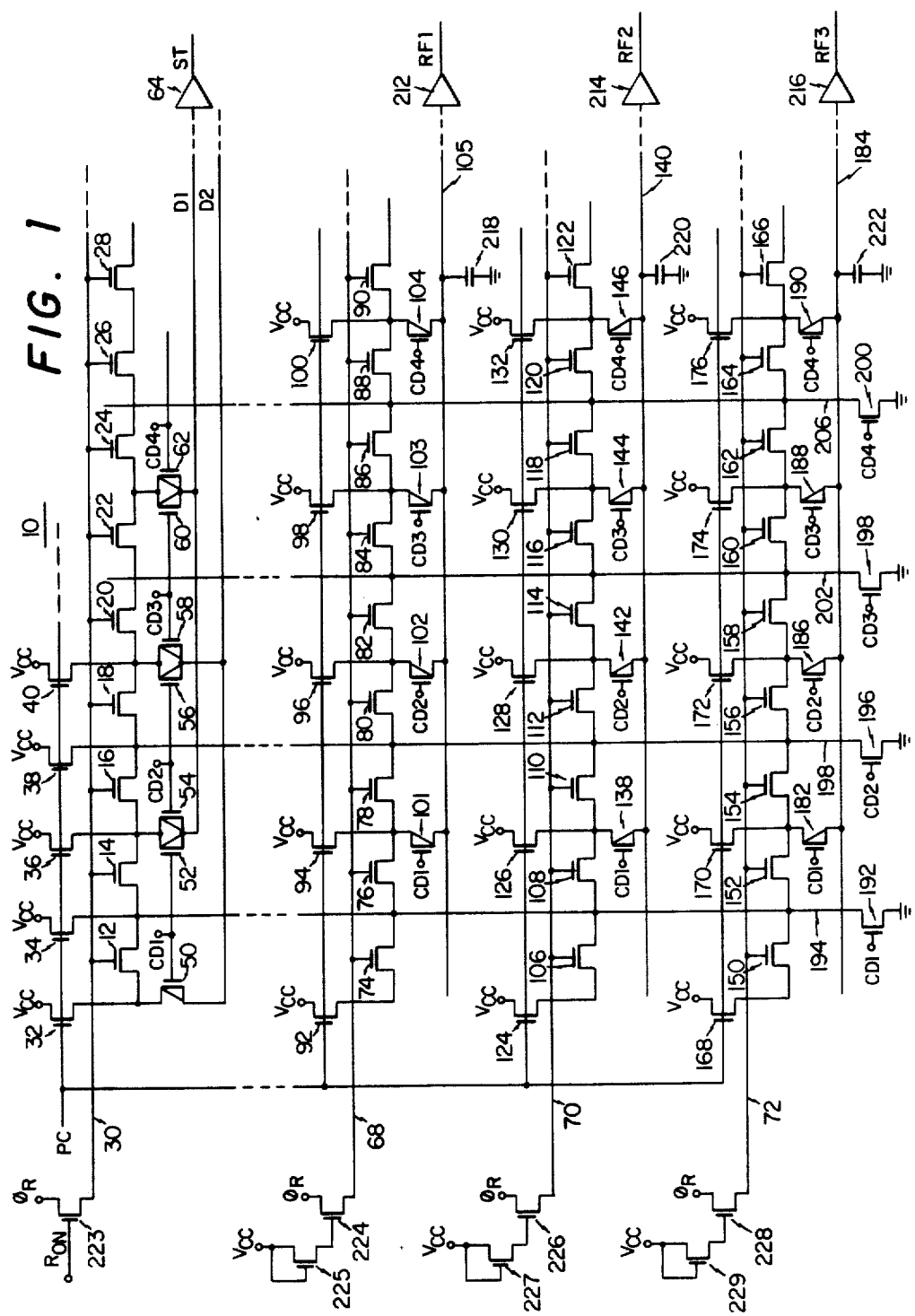
FIG. 1 is a schematic illustration of memory transistors and reference transistors in a read only memory circuit in accordance with the present invention.

Referring now to FIG. 1, there is illustrated a semiconductor read only memory circuit 10 in accordance with the present invention. Circuit 10 includes a plurality of memory storage transistors 12-28, each having the gate terminal thereof connected to a word line 30. The overall memory array of circuit 10 includes a plurality of word lines such as 30, each having a plurality of memory storage transistors connected thereto. The memory storage transistors are organized in an array of rows and columns. The memory storage transistors along each row are connected to a common word line.

A precharge (PC) signal is applied to the gate terminals of transistors 32–40, each of which has the drain terminal thereof connected to a power terminal $V_{CC}$. The source terminal of transistor 32 is connected to the drain terminal of memory storage transistor 12. The source terminal of transistor 34 is connected to the source terminals of transistors 12 and 14. The source terminal of transistor 36 is connected to the drain terminals of transistors 14 and 16. The source terminal of transistor 38 is connected to the source terminals of transistors 16 and 18. The source terminal of transistor 40 is connected to the drain terminals of transistors 18 and 20. The signal PC is provided through a line 42. The pattern of the precharge transistors is continued along the row line for the memory storage transistors.

A depletion transistor 50 has the drain terminal thereof connected to the drain terminal of transistor 12 and the source terminal thereof connected to a data line D2. Transistor 50 receives at the gate terminal thereof a first column decode (CD1) signal. A depletion transistor 52 has the drain terminal thereof connected to the drain terminals of transistors 14 and 16 and the source terminal thereof connected to a data line D1. The gate terminal of transistor 52 is connected to receive the signal CD1.

A depletion transistor 54 has the drain terminal thereof connected to the drain terminals of transistors 14 and 16 and the source terminal thereof connected to the data line D1. The gate terminal of transistor 54 is connected to receive a second column decode (CD2) signal.

A depletion transistor 56 has the drain terminal thereof connected to the drain terminals of transistors 18 and 20 and the source terminal thereof connected to the data line D2. The gate terminal of transistor 56 is connected to receive the CD2 signal.

A depletion transistor 58 has the drain terminal thereof connected to the drain terminals of transistors 18 and 20 and the source terminal thereof connected to the data line D2. The gate terminal of transistor 58 is connected to receive a third column decode (CD3) signal.

A depletion transistor 60 has the drain terminal thereof connected to the drain terminals of transistors 22 and 24 and the source terminal thereof connected to the data line D1. The gate terminal of transistor 60 is connected to receive the signal CD3.

A depletion transistor 62 has the drain terminal thereof connected to the drain terminals of transistors 22 and 24 and the source terminal thereof connected to the data line D1. The gate terminal of transistor 62 is connected to receive a fourth column decode (CD4) signal. The pattern of depletion transistors with columm decode signals together with memory storage transistors continues for the word line 30.

The data line D1 is connected to an amplifier 64 which generates a state (ST) signal. The data line D2 is connected to a similar amplifier which is not shown. The illustrated embodiment of the present invention utilizes two data lines; however, the present invention can be equally well utilized in a memory having only one output data line.

The read only memory circuit 10 further includes a plurality of reference transistors. The present embodiment illustrates a memory having three reference transistors for each column of memory storage transistors. Each row of reference transistors has a corresponding reference word line shown as 68, 70 and 72.

Reference word line 68 is connected to the gate terminals of reference transistors 74–90. The PC signal is provided through line 42 to the gate terminals of precharge transistors 92–100, each of which has the drain terminal thereof connected to the power terminal $V_{CC}$. The source terminal of transistor 92 is connected to the drain terminal of reference transistor 74. The source terminal of transistor 94 is connected to the drain terminals of transistors 76 and 78. The source terminal of transistor 96 is connected to the drain terminals of transistors 80 and 82. The source terminal of transistor 98 is connected to the drain terminals of transistors 84 and 86. Likewise, the source terminal of transistor 100 is connected to the drain terminals of transistors 88 and 90. The pattern of precharge transistors and reference transistors continues along the reference word line 68.

A depletion transistor 101 has the drain terminal thereof connected to the junction of transistors 76 and 78. A depletion transistor 102 has the drain terminal thereof connected to the junction of transistors 80 and 82. A depletion transistor 103 has the drain terminal thereof connected to the junction of transistors 84 and 86. A depletion transistor 104 has the drain terminal thereof connected to the junction of transistors 88 and 90. The source terminals of transistors 101, 102, 103 and 104 are connected to a reference line 105. The column decode signals CD1, CD2, CD3, and CD4 are provided respectively to the gate terminals of transistors 101, 102, 103 and 104.

The reference word line 70 is connected to the gate terminals of reference transistors 106–122.

The PC signal is further transmitted through line 42 to the gate terminals of precharge transistors 124–132, each of which has the drain terminal thereof connected to the power terminal $V_{CC}$. The source terminals of transistors 124–132 are connected respectively to the drain terminals of transistors 106, 108 and 110, 112 and 114, 116 and 118, and 120 and 122.

A depletion transistor 138 has the drain terminal thereof connected to the junction of the drain terminals of transistors 108 and 110 and the source terminal thereof connected to a reference line 140. The gate terminal of transistor 138 is connected to receive the signal CD1. A depletion transistor 142 has the drain terminal thereof connected to the junction of the drain terminals of transistors 112 and 114 and the source terminal thereof connected to the reference line 140. The gate terminal of transistor 142 is connected to receive the CD2 signal.

A depletion transistor 144 has the drain terminal thereof connected to the junction of the drain terminals of transistors 116 and 118 and the source terminal thereof connected to the reference line 140. The gate terminal of transistor 144 is connected to receive the CD3 signal. A depletion transistor 146 has the drain terminal thereof connected to the junction of the drain terminals of transistors 120 and 122 and the source terminal thereof connected to the reference line 140. The gate terminal of transistor 146 is connected to receive the CD4 signal. The combination of depletion transistor and reference transistors continues along reference word line 70 to correspond to the memory transistors connected along the word line 30.

The reference word line 72 is connected to the gate terminals of reference transistors 150–166. The PC signal is further transmitted through line 42 to the gate terminals of precharge transistors 168–176, each of which has the drain terminal thereof connected to the power terminal $V_{CC}$. The source terminal of transistors 168–176 are connected respectively to the drain terminals of transistors 150, 152 and 154, 156 and 158, 160 and 162, and 164 and 166.

A depletion transistor 182 has the drain terminal thereof connected to the junction of the drain terminals of transistors 152 and 154 and the source terminal thereof connected to a reference line 184. The gate terminal of transistor 182 is connected to receive the CD1 signal. A depletion transistor 186 has the drain terminal thereof connected to the drain terminals of transistors 156 and 158 and the source terminal thereof connected to the reference line 184. The gate terminal of transistor receives the CD2 signal.

A depletion transistor 188 has the drain terminal thereof connected to the junction of the drain terminals of transistors 160 and 162 and the source terminal thereof connected to the reference line 184. The gate terminal of transistor 188 is connected to receive the CD3 signal. A depletion transistor 190 has the drain terminal thereof connected to the drain terminals of transistors 164 and 166 and the source terminal thereof connected to the reference line 184.

A transistor 192 has the drain terminal thereof connected to a line 194, the source terminal thereof grounded and the gate terminal thereof connected to receive signal CD1. A transistor 196 has the drain terminal thereof connected to a line 198, the source terminal thereof grounded and the gate terminal connected to receive signal CD2. A transistor 200 has the drain terminal thereof connected to a line 202, the source terminal thereof grounded and the gate terminal thereof connected to receive signal CD3. A transistor 204 has the drain terminal thereof connected to a line 206, the source terminal thereof grounded and the gate terminal thereof connected to receive signal CD4.

Line 194 is connected to the junction of the source terminals of transistor pairs 12 and 14, 74 and 76, 106 and 108, and 150 and 152. Line 194 is further connected to the source terminal of precharge transistor 34. Line 198 is connected to the junction of transistor pairs 16 and 18, 78 and 80, 110 and 112, and 154 and 156. Line 198 is further connected to the source terminal of transistor 38. Line 202 is connected to the junctions of the source terminals of transistor pairs 20 and 22, 82 and 84, 114 and 116 and 158 and 160. Line 206 is connected to the junctions of the source terminals of transistors 24 and 26, 86 and 88, 118 and 120, and 162 and 164.

Reference line 105 is connected to the input of an amplifier 212 which produces a first reference (RF1) signal. Reference line 140 is connected to the input of an amplifier 214 which produces a second reference signal (RF2). The reference line 184 is connected to the input of an amplifier 216 which produces a third reference signal (RF3).

A capacitor 218 is connected between reference line 105 and ground. A capacitor 220 is connected between reference line 140 and ground. A capacitor 222 is connected between reference line 184 and ground.

A transistor 223 has the gate terminal thereof connected to receive a row on ($R_{on}$) which is received from a decoder that decodes an address to select a word line. The drain terminal of transistor 223 is connected to receive a clock signal $0_R$. The source terminal of transistor 223 is connected to the word line 30. When the signal $R_{on}$ is the high state the signal $0_R$ is propagated through transistor 223 to the word line 30.

A transistor 224 has the drain terminal thereof connected to receive the clock signal $0_R$ and the source terminal thereof connected to the reference word line 68. The gate terminal of transistor 224 is connected to the source terminal of a transistor 225 which has its gate and drain terminal connected to the power terminal $V_{CC}$.

A transistor 226 has its drain terminal connected to receive the clock signal $0_R$ and its source terminal connected to the reference word line 70. The gate terminal of transistor 226 is connected to the source terminal of a transistor 227. The gate and drain terminals of transistors 227 are connected to the power terminal $V_{CC}$.

A transistor 228 has its drain terminal connected to receive the clock signal $0_R$ and its source terminal connected to the reference word line 72. The gate terminal of transistor 228 is connected to the source terminal of transistor 229. The gate and drain terminals of transistor 229 are connected to the power supply terminal $V_{CC}$.

The clock signal $0_R$ is a typical clock signal generated by conventional circuitry in response to receipt of an address and selection command and a memory which includes circuit 10. The selected word line which receives the $R_{on}$ signal simultaneously receives the clock signal $0_R$ along with the reference word lines 68, 70 and 72. Therefore the selected word line, such as 30, and the reference word lines 68, 70 and 72 have the same signal propagated along the word line at the same time.

It is preferred that the gate terminals of transistors 223, 224, 226 and 228 be driven to the same voltage to achieve the same voltage along the word lines. For the described embodiment the gate terminal of these transistors are driven to a voltage of $V_{cc}-V_t$.

Operation of the circuit of the present invention is now described in reference to FIG. 1. The ROM circuit 10 has a substantial number of memory storage transistors such as 12-28. Each of these memory storage transistors is fabricated to have one of a plurality of threshold voltages. The threshold voltage for a transistor is the gate-to-source voltage at which the transistor starts to become conductive. In the present embodiment, the memory storage transistors have one of four threshold voltages. The reference transistors in circuit 10 likewise are fabricated to have one of a plurality of threshold voltages. For the described embodiment each of the reference transistors has one of a plurality of threshold voltages.

The threshold voltages for the memory and reference transistors in FIG. 1 are illustrated in a chart in FIG. 2. The threshold voltages are represented by the terms VT1 through VT7 representing progressively greater threshold voltages. The memory storage transistors have threshold voltages VT1, VT3, VT5 and VT7. Seven threshold voltages are produced from four implants. The implants are additive which assures that each implant will have a greater amplitude than the lower numbered implants. As a result the difference in threshold voltages remains constant even if all of the implants are greater or lesser due to processing variations.

FIG. 2 shows the implants required to produce the desired threshold voltages. For example, for a 3.0 volt implant of VT6 there must be two 0.5 volt implants followed by a 2.0 volt implant.

For each column in the array of memory storage transistors there are provided in circuit 10 a set of three reference transistors. Each of the reference transistors in a set has a different threshold voltage. For example, in the column having the memory storage transistor 12 there is provided the set of reference transistors 76, 108 and 152. For the described example reference transistor 76 has a VT2 threshold, transistor 108 has a VT4 threshold and transistor 152 has a VT6 threshold. The reference transistors 76, 108 and 152 are also used with memory transistor 12. The transistors 74, 106 and 150 are fabricated to have a VT7 threshold to insure that they are never turned on. The set of reference transistors 80, 112 and 156 correspond to transistors 76, 108 and 152 and operate with memory transistors 16 and 18. Likewise transistors 78, 110 and 154 have VT7 thresholds. This pattern continues across the array of reference transistors. The reference transistors which have the VT7 thresholds and never turn on serve to apply a corresponding load on the reference word lines as that on the memory word lines to assure equal rise times on all of the word lines.

A word line drive signal, which is shown as line 232 in FIG. 3, is applied to the data word line 30 as well as to the reference word lines 68, 70 and 72 as a result of the $0_R$ clock signal. Note that the word line voltage 232 progressively increases in amplitude with time.

At the start of each memory cycle the ROM circuit 10 is precharged to an initial condition. The precharge signal PC applied through line 42 renders conductive each of the precharge transistors connected thereto. Each of the precharge transistors pulls a corresponding node to a high voltage state. For example, the drain and source terminals of transistor 12 are precharged to a high voltage state by operation of the precharge transistors 32 and 34. This operation occurs likewise for each of the other memory and reference transistors in the ROM circuit 10.

A portion of the address provided to the ROM circuit 10 is decoded to select a word line, such as word line 30. The reference word lines 68, 70 and 72 are activated concurrently with any one of the data word lines. The remainder of the address provided to circuit 10 is decoded to generate column decode signals which are shown as, for example, signals CD1-CD4. The selection of a word line together with generating a column decode signal serves to select one memory transistor to be read and generate an output data state. In the embodiment of the present invention, each of the data transistors has one of four threshold voltages so that each memory transistor can provide two bits of data.

After the precharge operation is complete, one of the column decode signals is activated. For example, if signal CD1 is activated, transistor 192 is driven to a conductive state to pull line 194 to ground. The signal CD1 further activates transistor 52 to connect the data line D1 to the drain terminal of transistor 14. At this time the voltage of the word line signal has not progressed to the point where it could turn on transistor 14. A similar operation occurs for the reference transistors 76, 108 and 152 which are connected respectively to the reference lines 105, 140 and 184. The data line D1 as well as the reference lines 105, 140 and 184 are maintained at a high voltage state prior to the word line activating either the data or any one of the reference transistors. When any one of these transistors is made conductive, the corresponding data or reference line will be pulled from the high voltage state to a low voltage state.

The source terminals for the memory transistor 14 and the reference transistors 76, 108 and 152 are maintained at essentially ground while the gate terminals of these transistors receive the progressively increasing voltage thereby progressively increasing the gate-to-source voltage applied thereto. Note that the configuration of the ROM circuit 10 is such that the propagation delay of the word line voltage along the word lines is the same for corresponding memory and reference transistors. This assures that the same voltage is present at corresponding modes on the word lines. There is a set of reference transistors for each column in the memory transistor array. Thus, the word line voltage applied to the memory transistor is essentially the same as the word line voltage applied to the reference transistors.

Referring now to FIG. 3 there is shown the drain voltages for memory and reference transistors as the function of the word line voltage applied to the gate terminals thereof for each threshold voltage. The column decode (CD) signal and clock signal $0_R$ are also shown. Note that all of the drain terminals start at a high voltage state. As the transistor becomes conductive, the drain terminal is discharged through the transistor to the source terminal which is held at ground. Note that the transistors, both data and reference, are turned on in the sequence of increasing threshold voltages. The time sequence of turn on is utilized in the present invention to decode the multiple threshold levels stored in the memory transistors.

Returning to the previous example, the memory transistor 14 has either the VT1, VT3, VT5 or VT7 threshold voltage. The reference transistors 76, 108 and 152 are fixed repectively with the reference threshold voltages VT2, VT4 and VT6. Since each of these threshold voltages is different, there will be a time spacig between the transistion of the transistors. As can be seen in reference to FIG. 3, the reference threshold voltages cause transistions which form windows that bracket the data threshold voltage transistions. Thus, the memory transistors can be decoded in a time comparison with the transistion of the reference transistors.

Referring now to FIG. 4 there is shown logic circuitry for decoding the outputs of amplifiers 64, 212, 214 and 216. The state signal from amplifier 64 is input to latch circuits 234, 236 and 238. The reference signals RF2, RF1 and RF3 are input respectively to the latches 234, 236 and 238. The state signal serves to lock the latches to have outputs corresponding to the reference inputs. Outputs of the latches are represented as signals L1, L2 and L3. The L2 signal is input to a state decode circuit 240 while the L1 and L3 signals are input to a state decode circuit 242. First and second output signals are produced from the state decode circuits 240 and 242, respectively. The two binary output signals represent the two bit data state fabricated in the selected memory transistor.

The logical operation of the decode circuitry shown in FIG. 4 is illustrated in the chart in FIG. 5. This chart shows the four possible output states which result from combinations of outputs L1, L2 and L3 from the latches 234, 236 and 238.

Referring now to FIG. 6, there is shown a logic schematic diagram for a decoding and latching circuit to receive the state and reference signals as shown in FIG. 1. The RF1 signal is provided as a first input to a NOR gate 248 which has the output connected as a first input to a NOR gate 250. The output of gate 250 provides the second input to gate 148.

The RF2 signal is provided as a first input to a NOR gate 252 which has the output thereof connected as a first input to a NOR gate 254. The output of gate 254 provides the second input to NOR gate 252.

The RF3 signal provides a first input to a NOR gate 256 which has the output thereof connected as a first input to a NOR gate 258. The output of NOR gate 258 is connected to provide the second input to NOR gate 256.

The signal ST from amplifier 64 provides the second input to NOR gates 250, 254 and 258. The L1, L2 and L3 signals are output from gates 250, 254 and 256, respectively and correspond to the L1, L2 and L3 signals shown in FIGS. 4 and 5.

The L1 and L3 signals are input to a NOR gate 260 which produces the OUTPUT 2. The L2 signal itself provides the OUTPUT 1. The circuit shown in FIG. 6 provides the decoding to produce the two bit OUTPUTS as shown in the logical chart in FIG. 5.

In summary, the present invention comprises a ROM circuit for use with multi-bit memory transistors. The memory transistors are arranged in rows and columns with a set of reference transistors for each column. A selected memory transistor is activated concurrently with its corresponding reference transistors to produce time sequential state and reference signals. The state and reference signals indicate the transistions of the transistors from a nonconductive state to a conductive state. Decoding circuitry is provided to compare the relative time transistions for producing an output signal which corresponds to the threshold voltage and thus data state for the selected memory transistor.

I claim:
1. A read only memory circuit, comprising:
   a memory transistor fabricated to have one of a plurality of threshold voltages each corresponding to a data state,
   a plurality of reference transistors each having a separate threshold voltage,
   means for driving said memory transistor and said reference transistors to create transitions from a first state to a second state in a manner to generate a time spacing between said transistions of each of said reference transistors and said memory transistor depending on the relative threshold voltages of said reference transistors and said memory transistor, and means for comparing the time of transition of said memory transistor relative to the times of transition of said reference transistors and for generating output signals representive of said data state of said memory transistor in response to said comparison.

2. A read only memory circuit comprising:

a plurality of memory transistors each fabricated to have one of a plurality of threshold voltages, each threshold voltage corresponding to a data state, a plurality of sets of reference transistors, each reference transistor within said set having a separate threshold voltage, means for driving a selected one of said memory transistors and a corresponding set of said reference transistors to create transitions from a first state to a second state, in a manner to generate a time spacing between said transitions of said reference transistors and said memory transistors, depending on the relative threshold voltages of said reference transistors and said memory transistor, and means for comparing the time of transition of said selected memory transistor relative to said corresponding reference transistors and for generating an output signal representing said data state of said selected memory transistor in response to said comparison.

3. A read only memory unit comprising:

a plurality of memory transistors arranged in an array of rows and columns, each of said memory transistors fabricated to have one of a plurality of data threshold voltages each corresponding to a data state, a set of reference transistors for each column of said memory transistors, each reference transistor within said set having a separate reference threshold voltage, means for driving a selected one of said memory transistors and the corresponding reference transistors to create transitions from a first state to a second state in a manner to generate a time spacing between said transitions of said reference transistors and said memory transistors depending on the relative threshold voltages of said reference transistors and said memory transistor, and means for comparing the time of transition of said selected memory transistor with respect to the times of transition of said reference transistors corresponding to said selected memory transistor and generating an output signal representing said data state of said selected memory transistor in response to said comparison.

4. A read only memory circuit comprising:

a plurality of memory transistors arranged in an array of rows and columns, each row of said memory transistors having the control elements thereof connected to a corresponding data word line, each memory transistor fabricated to have one of a plurality of data threshold voltages wherein each data threshold voltage corresponds to a data state, a similar set of reference transistors for each column of said memory transistors, each reference transistor within the set having a separate reference threshold voltage, said reference transistors having the same reference threshold voltages connected in common to corresponding reference world lines, means for applying a concurrent changing amplitude drive signal to a selected one of said data word lines and to said reference word lines for driving a selected one of said memory transistors and the reference transistors for the corresponding column of said selected memory transistor to create transitions from a first state to a second state in a manner to generate a time spacing between said transitions of said reference transistors and said memory transistors depending on the relative threshold voltages of said reference transistors and said memory, and means for comparing the time of transition of said selected memory transistor relative to the times of transition of said correspoding reference transistors and generateing output signals representive of said data state of said selected memory transistor in response to said comparison.

5. A method of operation for a read only memory comprising the steps of:

applying concurrent time changing drive signals to a selected memory transistor and to a plurality of reference transistors to drive said transistors to create transitions from a first state to a second state in a manner to generate a time spacing between said transistions of said reference transistors and said memory transistors depending on the relative threshold voltages of said reference transistors and said memory transistor wherein the selected memory transistor has one of a plurality of threshold voltages, each corresponding to a data state and each of said reference transistors has a different threshold voltage from that of the other reference transistors, comparing the time of transition of said selected memory transistor with respect to the time of transition of said reference transistors, and generating an output signal representing said data state of said selected memory transistor in response to said step of comparing.

* * * * *